WIDE RANGE VARIABLE FREQUENCY CRYSTAL OSCILLATOR

Filed Jan. 28, 1964

INVENTOR
Daniel J. Healey III
BY Ernest P. Klipfel
ATTORNEY

United States Patent Office 3,254,314
Patented May 31, 1966

3,254,314

WIDE RANGE VARIABLE FREQUENCY CRYSTAL OSCILLATOR

Daniel J. Healey III, Baltimore, Md., assignor to Westinghouse Electric Corporation, Pittsburgh, Pa., a corporation of Pennsylvania Filed Jan. 28, 1964, Ser. No. 340,722
7 Claims. (Cl. 331—159)

The present invention relates to crystal oscillators and more particularly to a wide range variable frequency crystal oscillator.

In using a vibrating crystal as the resonator of a variable frequency oscillator the tuning range that can be obtained is limited because conventional sustaining circuits such as the Pierce-Colpitts oscillator are employed. An inductance element can be connected in series circuit combination with the crystal to extend the tuning range but only a small increase is possible, because of resonance of the added element with the crystal capacitance and circuit capacitance. If an inductance element is connected in parallel with the crystal, oscillation occurs in the circuit at an undesired lower frequency determined by the added element and the total facing capacitance and not by the crystal.

An object of the present invention is to provide a crystal oscillator having a tuning range substantially greater than available in the prior art circuits.

Another object of the present invention is to provide a variable frequency crystal oscillator which substantially suppresses oscillations at frequencies other than the desired frequency range.

Another object of the present invention is to provide a wide range variable frequency crystal oscillator having increased stability over a wider frequency range than heretofore available.

Briefly, these and other objects are obtained by the insertion of a frequency selective network in a cascode amplifier which is coupled to a resonator to sustain the frequency of oscillation of the crystal within the resonator over a desired tuning range while suppressing undesired lower frequencies.

Further objects and advantages of the present invention will be readily apparent from the following detailed description taken in conjunction with the drawing in which.

Figure 1:
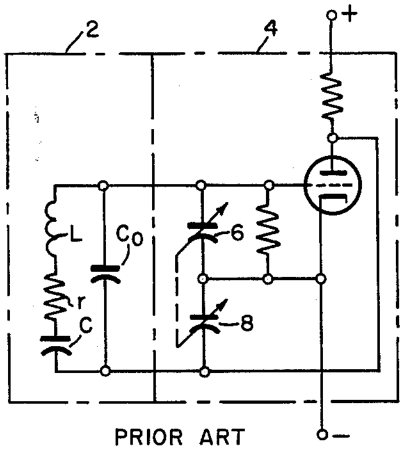
FIGURE 1 is a schematic diagram of a tunable Pierce-Colpitts oscillator circuit in accordance with the prior art.
Figure 2:
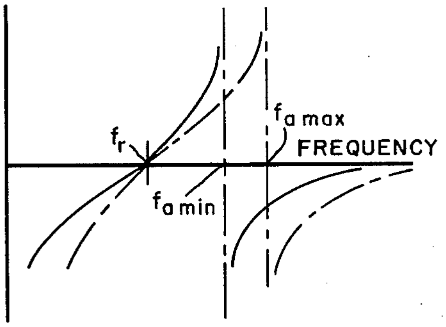
FIGS. 2 and 3 are characteristic curves useful in understanding the present invention.

FIGURE 1 illustrates a conventional Pierce-Colpitts oscillator which is an anti-resonant oscillator wherein a sustaining circuit 4 is effectively loosely coupled to a resonator 2. The equivalent network of the vibrating crystal is illustrated as an inductance element L, resistance element $r$ and capacitance element C connected in series circuit combination across another capacitance element $C_0$. Capacitors 6 and 8, usually gang tuned, vary the circuit capacitance facing the resonator 2 to tune the oscillator thereby providing an oscillating frequency range between $f_{a\ min}$ and $f_{a\ max}$. FIG. 2 is a curve showing the reactance-frequency characteristic of the resonator 2 when paralleled by capacitors 6 and 8. The oscillator frequency is $f_a$. The frequency $f_{a\ max}-f_{a\ min}$ is the tuning range of the oscillator wherein $f_{a\ min}$ exists when capacitors 6 and 8 are at maximum capacitance setting, and $f_{a\ max}$ exists when capacitors 6 and 8 are at minimum capacitance setting. The anti-resonant frequency $f_a$ is shifted from the resonant frequency $f_r$ by an amount $$\Delta f \cong \frac{f_r}{2}\left(\frac{C}{C_0}\right)$$

for the crystal alone. In a circuit including the sustaining circuit 4 as well as the crystal the maximum frequency shift from the resonant frequency $f_r$ to the oscillation frequency $f_{a\ max}$ is $$\Delta f_{max.} \cong \frac{f_r}{2}\left(\frac{C}{C_0+C_{min.}}\right)$$

where $C_0$ is the shunt capacitance of the crystal unit and $C_{min}$ is the minimum circuit capacitance facing the resonator 2. The minimum frequency shift from resonance $f_r$ is as determined by $$\Delta f_{min.} \cong \frac{f_r}{2}\left(\frac{C}{C_0+C_{max.}}\right)$$

where the permissible $C_{max}$ depends on the effective transconductance of the sustaining circuit 4. A typical example is as follows:

$f_r=28\times10^6$ cycles per second
$C=0.02$ picofarad
$C_0=5.0$ picofarads
$C_0+C_{min}=12.0$ picofarads
$r=20$ ohms
$g_{m\ max}=6\times10^{-3}$ amps per volt If the facing negative resistance of the sustaining circuit must be 20 ohms, the maximum circuit facing capacitance is given by $$C=\sqrt{\frac{gm}{\omega^2 r}}=\sqrt{\frac{6\times10^{-3}}{(6.28\times28)^2\times10^{12}(20)}}=31 \text{ picofarads}$$

$$f_{a\ max.}-f_{a\ min.}=\frac{28,000}{2}\left(\frac{0.02}{12.0}-\frac{0.02}{31+5}\right)$$
$$=15,600 \text{ cycles per second.}$$

Figure 3:
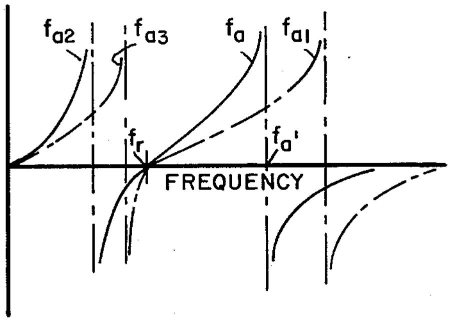

If an inductance element is connected in parallel circuit relationship with the resonator 2 an anti-resonant frequency $f_a'$ results which is higher than $f_a$ of FIGURE 2. The frequencies at which it is desired that the oscillator operate lie between $f_a$ and $f_{a1}$ in FIGURE 3. However, when the crystal-inductor combination is connected in a Pierce-Colpitts oscillator circuit, oscillation rather occurs in the undesired frequency range between frequencies $f_{a2}$ and $f_{a3}$ depending on the setting of the total capacitance facing the crystal.

Figure 4:
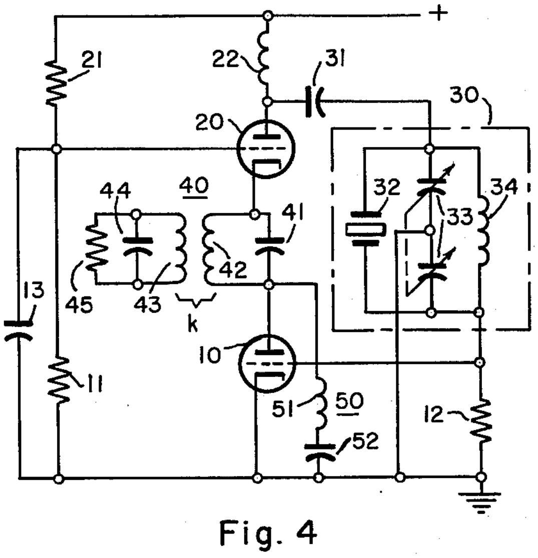
FIG. 4 is an electrical schematic diagram of an illustrative embodiment of the present invention.

The present invention as illustrated in FIGURE 4 prevents oscillation between the undesired frequency range $f_{a2}$ and $f_{a3}$ and yields oscillation between the desired frequency range $f_a$ and $f_{a1}$ with a stability dependent principally on the stability of the resonator circuit comprised of the crystal resonator and its facing reactance.

In FIGURE 4, two signal translating devices such as high transconductance vacuum tubes 10 and 20 are effectively series connected in a cascode amplifier combination. Each tube 10 and 20 has a plate, a cathode and a grid, or more broadly, an output electrode, a common electrode and a control electrode. The first tube 10 is connected in a grounded cathode stage while the second tube 20 is connected in a grounded grid stage. A resonator 30 is connected in frequency controlling combination across the plate of tube 20 and grid of tube 10. This arrangement essentially yields the transconductance of one tube insofar as the oscillator loop gain is concerned. If the cathode of tube 20 and plate of tube 10 were directly connected together the difficulties of prior art circuits would occur; namely, oscillation between the undesired frequency range $f_{a2}$ and $f_{a3}$. The present invention, however, inserts a frequency selective network 40 between the two tubes.

More particularly, the cascode combination includes resistors 11 and 21 to provide proper biasing of tube 20 so that equal plate to cathode voltage appears on both tubes 10 and 20. Capacitor 13, connected across resistor 11 is essentially a short circuit at the desired tunable frequency range. The grid of tube 10 is grounded through a grid biasing resistor 12. The inductive element 22 is merely a radio frequency choke coil and could be replaced by a resistance element having a resistance very much larger than the maximum reactance magnitude of the two gang tuning capacitor 33 but would require use of a higher plate voltage supply.

The resonator 30 is connected as a feedback element between the plate of the tube 20 and the grid of the tube 10 through a capacitor 31 which is essentially a short circuit at the desired frequency range of tuning. A crystal unit 32, for example of quartz, is parallelly connected across the two gang tuning capacitor 33 which has the common rotor connected to ground. An inductance element 34 is employed as described previously to provide a greater separation between the crystal resonant frequency and its anti-resonant frequency with minimum facing capacitance.

The frequency selective network 40 provides the drive point impedance of a multipole band pass filter shown as a double tuned transformer. A capacitor 41 is tuned with the primary winding 42. The secondary winding 43 of the transformer is magnetically coupled to the primary winding 42 with a coefficient $k$. Capacitor 44 is tuned with the secondary winding 43 and resistor 45 terminates the network.

The series combination 50 of a capacitance element 51 and inductance element 52 connects the plate of the tube 10 to ground to minimize the loss of oscillator loop gain at the desired frequency range. Element 51 is essentially a short circuit at the desired operating frequency range and the inductor 52 resonates with the reactance from tube 10 to ground to minimize loss of oscillator loop gains due to shunting reactance at plate of tube 10.

Figure 5:
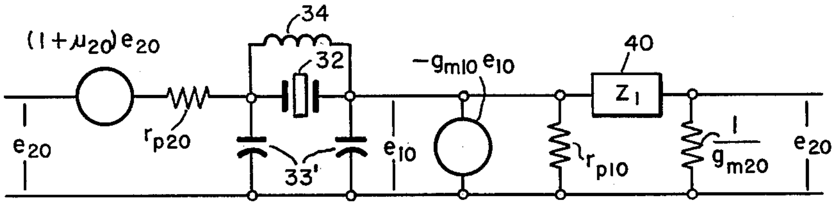
FIG. 5 is an equivalent electrical circuit diagram of the illustrative embodiment shown in FIGURE 4.

FIGURE 5 shows the equivalent electrical circuit of the apparatus in FIGURE 4 wherein the subscripts 10 refer to the tube 10 and the subscripts 20 refer to the tube 20. The input impedance presented by the frequency selective network 40 is indicated as Z1. Capacitors 33' are each representative of ½ the gang-tuned capacitor 33 of FIGURE 4 but also includes the vacuum tube and wiring capacitance of the circuit.

At the undesired frequency band $f_{a3}-f_{a2}$, the impedance of the frequency sensitive network, $Z_1$, is made on the order of twenty times the value of $1/gm$ of the tube 10. Under these conditions the loop gain is suppressed by about 26 db in the undesired frequency range of $f_{a2}-f_{a3}$ and oscillation does not occur in that frequency range. The capacitor 44 and resistor 45 of the frequency selective network 40 determine the bandwidth $f_{a3}-f_{a2}$ over which the desired high impedance exists, and the magnitude of this impedance is approximately twice the magnitude of resistor 45 multiplied by the ratio of the magnitudes of the capacitance of element 44 divided by the magnitude of the capacitance of element 41 when the coupling coefficient $k$ is properly set.

Figure 6:
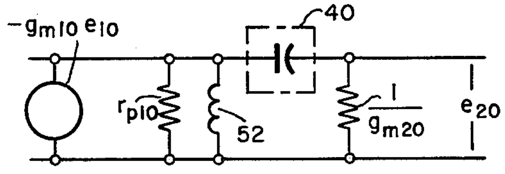
FIG. 6 is an equivalent electrical circuit of a portion of the circuitry shown in FIGURE 5 when operating in the desired frequency range.

At the desired range of frequency between $f_a$ and $f_{a1}$ the impedance presented by the frequency selective network 40 is capacitive. This is as shown in the equivalent circuit of FIGURE 6. The reactance of the selective network 40 is very much less than the input resistance of tube 20 which is approximately $1/gm_{20}$ at the frequency range $f_{a1}-f_a$.

Accordingly, the impedance inserted by the present invention between the grounded cathode stage and grounded grid stage of the cascode combination is such that oscillations at the desired frequency range determined by the anti-resonance of capacitor 33 and inductor 34 in the resonator 30 are substantially suppressed. Further, at the frequency range of interest between $f_a$ and $f_{a1}$ the network 40 provides negligible impedance and the oscillator circuit performs similar to a Pierce oscillator circuit with the frequency of oscillation determined by the crystal unit 32 and the susceptance connected in parallel with the crystal unit. The susceptance is the net reactance of the combination of the capacitor 33 and inductance 34 connected in parallel across the crystal unit 32. The susceptance will have a minimum value less than can be obtained with the conventional Pierce circuit.

The tuning range of an oscillator constructed in accordance with the present invention provides a 6 to 1 increase in the tuning range of prior art crystal oscillators. The present invention was incorporated in an amateur radio station single side band apparatus operating at 14,000 kilocycles and 21,000 kilocycles. Utilizing the same crystal, conventional circuitry provided tuning of only 10,000 cycles per second while a tuning range of 60,000 cycles per second was realized with adequate stability for single side band voice communications when utilizing the present invention.

While the present invention has been described with a degree of particularity for the purposes of illustration, it is to be understood that all modifications, equivalents and substitutions within the spirit and scope of the present invention are here and meant to be included. For example, although the present invention has been described with the use of tubes it is to be understood that semiconductor circuitry such as transistors may also be used.

I claim as my invention:

1. A wide range variable frequency crystal oscillator comprising, in combination; resonator means including a vibrating crystal and an induction element connected in parallel circuit combination; a first signal translating device having cathode, grid and plate electrodes; a second signal translating device having cathode, grid and plate electrodes; circuit means for connecting said first device as a grounded cathode stage; other circuit means for connecting said second device as a grounded grid stage; a frequency selective circuit interconnecting the plate of said first device to the cathode of said second device; another circuit means connecting said resonator means to the plate of said second device and the grid of said first device; said frequency selective circuit having a high impedance to frequencies below the desired frequency range of oscillation and a low impedance to frequencies in the desired range.

2. The apparatus of claim 1 wherein said frequency selective circuit is a two pole network.

3. The apparatus of claim 1 wherein said frequency selective circuit is a two pole network one side of which is terminated by a resistance element and the other side of which interconnects said grounded cathode stage to said grounded grid stage at the opposite end.

4. In combination, a first signal translating device having cathode, grid and plate electrodes; a second signal translating device having cathode, grid and plate electrode; a frequency selective network; circuit means for connecting said first signal translating device and said second signal translating device in cascode amplifier combination with the frequency selective network interconnecting the plate of said first device and the cathode of said second device; resonator means having a plurality of anti-resonant frequencies; and means for varying each anti-resonant frequency over a predetermined range; said resonator means connected between the grid of said first device and the plate of said second device and in frequency controlling relationship with said cascode amplifier combination; said frequency selective network having an input impedance which is substantially smaller over a selected anti-resonant frequency range than over the undesired frequencies at which a specific high impedance is provided.

5. A wide range variable frequency crystal oscillator for a desired frequency range of oscillation comprising, in combination: a first signal translating device; a second signal translating device; a frequency selector network interconnecting said first signal translating device and said second translating device in cascode amplifier combination; a feedback network including a crystal resonator and an inductance element connected in frequency controlling combination with said cascode amplifier combination; means for varying the anti-resonant frequency of said feedback network; said frequency selective network having a high impedance to frequencies below the desired frequency range of oscillation and a low impedance in the desired frequency range.

6. In combination; resonator means including a crystal and an inductance element connected in parallel circuit combination; means for varying the frequency range of said resonator means; a cascode amplifier including a grounded cathode stage and a grounded grid stage coupled to said resonator to sustain the frequency of oscillation of said resonator means; and a frequency selection circuit interposed between said grounded cathode stage and grounded grid stage; said frequency selection circuit including a doubly tuned transformer and a resistive element for delivering substantially all of the power in the oscillator to the resistive element when the frequency of said oscillator is of an undesired range, but delivering substantially all the power to said grounded grid stage and said resonator to permit oscillations to occur at the frequency range of interest.

7. In combination; a first signal translating device having a cathode electrode, a grid electrode and a plate electrode; a second signal translating device having a cathode electrode, a grid electrode and a plate electrode; a frequency selective network; circuit means for connecting said first device and said second device in cascode amplifier combination with said frequency selective network interconnecting the plate electrode of said first signal translating device to the cathode electrode of said second signal translating device; circuit means grounding the cathode electrode of said first signal translating device; other circuit means grounding the grid electrode of said second signal translating device; resonator means having a plurality of frequency bands one of which is a desired frequency band; said resonator means connected between the plate electrode of said second signal translating device and the grid electrode of said first signal translating device; said frequency selective network having an input impedance which is substantially less at frequencies within the desired frequency range than at lower frequencies.

References Cited by the Examiner

UNITED STATES PATENTS

| | | | |
|---|---|---|---|
| 2,757,288 | 7/1956 | Jacobsen | 331—159 |
| 2,775,659 | 12/1956 | Nelson | 330—70 |
| 2,881,265 | 4/1959 | Swierczak | 330—70 |
| 2,994,767 | 1/1961 | Rhodes | 331—116 |
| 2,995,669 | 8/1961 | Hugenholtz | 331—116 |

FOREIGN PATENTS

| | | |
|---|---|---|
| 1,187,824 | 9/1959 | France. |
| 668,825 | 3/1952 | Great Britain. |

ROY LAKE, *Primary Examiner.*

JOHN KOMINSKI, *Assistant Examiner.*